United States Patent [19]

Saito

[11] Patent Number: 5,559,452

[45] Date of Patent: Sep. 24, 1996

[54] N CHANNEL OUTPUT DRIVER WITH BOOSTED GATE VOLTAGE

[75] Inventor: Teruhiko Saito, Kasugai, Japan

[73] Assignee: Fujitsu Limited, Kawasaki, Japan

[21] Appl. No.: 420,487

[22] Filed: Apr. 12, 1995

[30] Foreign Application Priority Data

Apr. 13, 1994 [JP] Japan ..................... 6-075168

[51] Int. Cl.$^6$ ............................. H03K 19/0185
[52] U.S. Cl. .................. 326/88; 326/83; 326/27; 365/189.05
[58] Field of Search .................. 326/26, 27, 28, 326/17, 81, 83, 88; 327/536; 365/189.05

[56] References Cited

U.S. PATENT DOCUMENTS

| | | | |
|---|---|---|---|
| 4,622,479 | 11/1986 | Taylor | 326/88 |
| 4,692,638 | 9/1987 | Stiegler | 326/83 |
| 4,736,121 | 4/1988 | Cini et al. | 327/536 |
| 4,772,812 | 9/1988 | Desmarais | 326/88 |
| 4,806,798 | 2/1989 | Kanauchi | 326/83 |
| 5,081,371 | 1/1992 | Wong | 327/536 |
| 5,170,072 | 12/1992 | Ihara | 326/82 |
| 5,268,600 | 12/1993 | Yeu | 326/88 |

FOREIGN PATENT DOCUMENTS

| | | |
|---|---|---|
| 60-83419 | 5/1985 | Japan . |
| 63-287110 | 11/1988 | Japan . |
| 4-205786 | 7/1992 | Japan . |

Primary Examiner—Edward P. Westin
Assistant Examiner—Benjamin D. Driscoll
Attorney, Agent, or Firm—Nikaido, Marmelstein, Murray & Oram LLP

[57] ABSTRACT

Disclosed is an output circuit capable of improving the load driving performance of a semiconductor device. The output circuit has first and second N channel MOS transistors connected in series between a high-potential power supply and a low-potential power supply. Both transistors produce an output signal at a node therebetween in response to complementary input signals. The output circuit includes a booster circuit, connected to the first transistor. The booster circuit is supplied with power from the high-potential power supply. In response to a clock signal and an input signal for enabling the first transistor, the booster circuit produces a voltage higher than the potential level of the high-potential power supply and applies the higher voltage to the first transistor.

15 Claims, 8 Drawing Sheets

N CHANNEL OUTPUT DRIVER WITH BOOSTED GATE VOLTAGE

BACKGROUND OF THE INVENTION

1. Field of the Invention

The present invention relates generally to an output circuit in a semiconductor device, and in particular to an output circuit capable of improving the load driving performance of the semiconductor device.

2. Description of the Related Art

To improve the speed and the integration of elements in a semiconductor device, such as a semiconductor integrated circuit, the supply voltage needed by the integrated circuit should be as low as practical and the integrated circuit should have a low level output impedance. The semiconductor integrated circuit has an internal circuit and an output circuit. The output circuit receives a signal processed by the internal circuit and outputs a high or low level output signal to an external bus based on the power supplied from the power supply.

A host computer is connected to individual terminals via lines, forming a LAN (Local Area Network). Even if the power supply to the individual terminals is cut off to deactivate those terminals, the lines of the LAN are enabled high. When the lines are enabled high and power supply is stopped, the output circuit used in a terminal in the network should be set to a high impedance state. However, if the output circuit has a pull-up P channel MOS transistor and a pull-down N channel MOS transistor connected in series between a high-potential power supply and a low-potential power supply, the output circuit can not be set to a high impedance state. The reason for this is that the P channel MOS transistor incorporates a parasitic diode which prevents the output signal from being set to a high impedance state even if the power supply is blocked. In this respect, the output circuit used as a terminal in a LAN normally has a bipolar transistor or an N channel MOS transistor. The output circuit uses those transistors for the pull-up and pull-down transistors.

Figure 1:
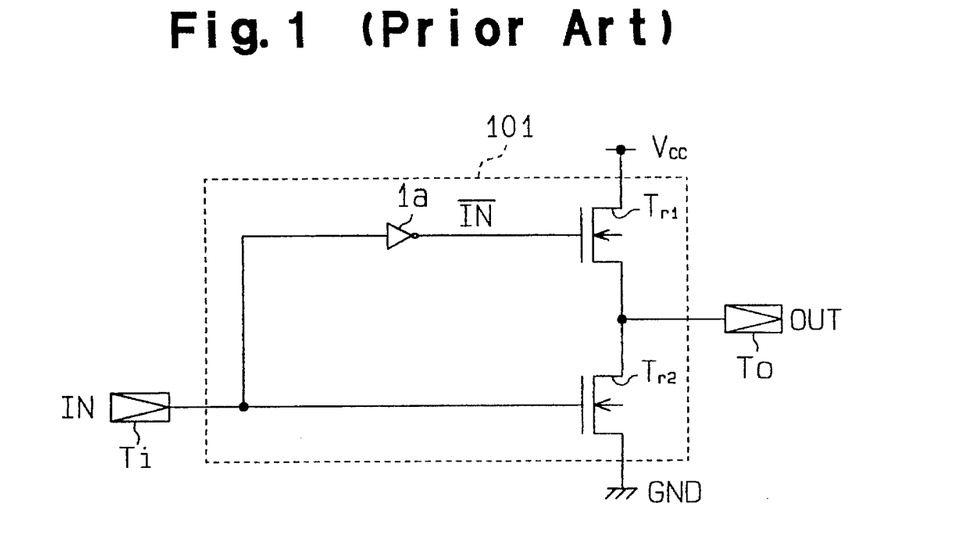
FIG. 1 is a circuit diagram showing a conventional output circuit.

FIG. 1 shows a first example of a conventional output circuit 101. The output circuit 101 comprises an inverter circuit 1a, a pull-up first N channel MOS transistor Tr1 and a pull-down second N channel MOS transistor Tr2. The inverter circuit 1a is connected between an input terminal Ti and the gate of the first N channel MOS transistor Tr1. The inverter circuit 1a outputs an inverted signal of an input signal IN as an input signal /IN to the gate of the first N channel MOS transistor Tr1. The second N channel MOS transistor Tr2 has a gate connected to the input terminal Ti with the input signal IN input to the gate. The first transistor Tr1 has a drain connected to a power supply $V_{CC}$ and a source connected to an output terminal To. The second transistor Tr2 has a drain connected to the output terminal To and a source connected to a ground GND as a low-potential supply.

With the supply voltage $V_{CC}$ supplied to this output circuit 101, when the input signal IN goes high, the inverter circuit 1a outputs a low level input signal /IN to the gate of the first transistor Tr1, turning off the first transistor Tr1. In response to the high input signal IN, the second transistor Tr2 turns on. The output circuit 101 then generates a low level output signal OUT from the output terminal To.

When the input signal IN goes low, the inverter circuit 1a outputs signal /IN high to the first transistor Tr1, turning the first transistor Tr1 on. In response to the low input signal IN, the second transistor Tr2 turns off. Then, the output circuit 101 outputs a high level output signal OUT from the output terminal To.

When power supply to the semiconductor integrated circuit including this output circuit 101 is cut off, the transistors Tr1 and Tr2 both turn off and the output circuit 101 is set to a high impedance state. Should a LAN connection (not shown) to the output terminal To be enabled high, the gate potentials of the first and second transistors Tr1 and Tr2 would be low enough to keep the output circuit 100 off. As a result, the parasitic diodes in the first and second transistors Tr1 and Tr2 will not operate.

When signal OUT is output high from the terminal To, the output circuit 101 provides the signal OUT at a level lower than the supply voltage $V_{CC}$, the difference being the threshold value of the first transistor Tr1. Therefore, should the output circuit 101 assert the signal OUT high, the circuit 101 will not have sufficient power to drive a load connected via the LAN connection.

Figure 2:
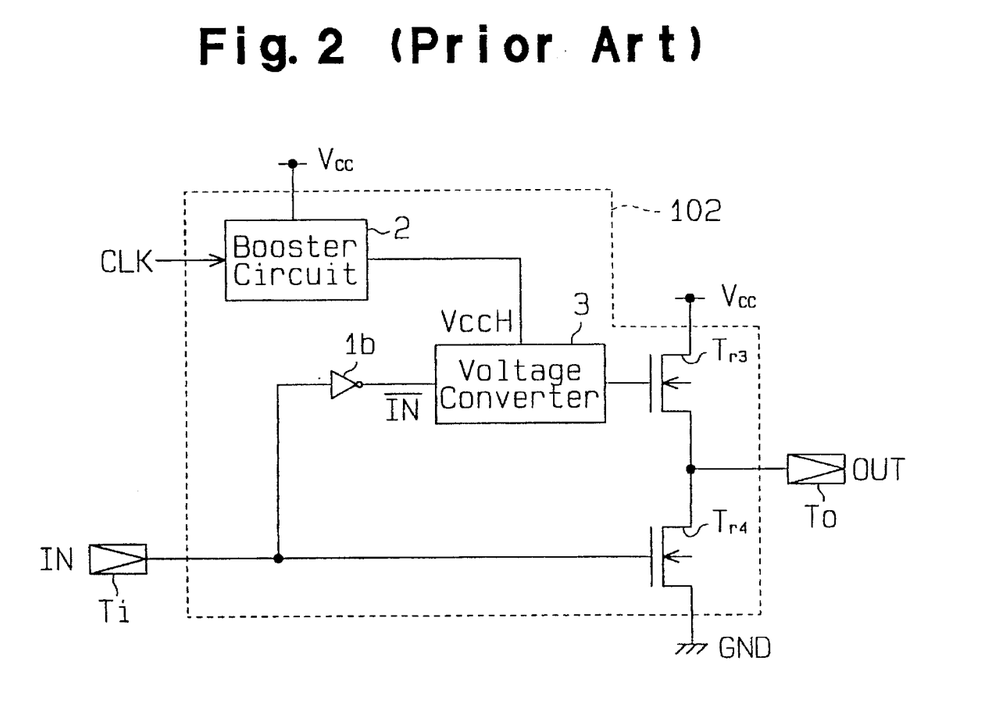
FIG. 2 is a circuit diagram showing another conventional output circuit.

FIG. 2 shows a second example of the conventional output circuit 102. The output circuit 102 comprises an inverter circuit 1b, first and second N channel MOS transistors Tr3 and Tr4, a booster circuit 2, which includes a transistor and a capacitor, and a voltage converter 3. The booster circuit 2 boosts the supply voltage $V_{CC}$ to a predetermined voltage in response to a received clock signal CLK. The booster circuit 2 produces an output voltage $V_{CC}H$ by boosting the supply voltage $V_{CC}$ of, for example, 5 V to about 10 V, and then outputs the output voltage $V_{CC}H$ to the voltage converter 3. The inverter circuit 1b inverts the input signal IN and supplies it as input /IN to the voltage converter 3. The second transistor Tr4 receives the input signal IN from its gate. In response to the high input signal IN, the voltage converter 3 outputs the output voltage $V_{CC}H$ from the booster circuit 2 to the gate of the first transistor Tr3. In response to the low input signal /IN, the voltage converter 3 outputs a low signal equivalent to the ground GND to the gate of the first transistor Tr3. The first transistor Tr3 has a drain connected to the power supply $V_{CC}$ and a source connected to the output terminal To. The second transistor Tr4 has a drain connected to the output terminal To and a source connected to the ground GND.

With the supply voltage $V_{CC}$ supplied to this output circuit 102, when the input signal IN goes high, the inverter circuit 1b outputs a low level input signal /IN to the gate of the first transistor Tr3 in response to that input signal IN. This turns the first transistor Tr3 off. In response to the high input signal IN, the second transistor Tr4 is turned on. The output circuit 102 then outputs the low output signal OUT from the output terminal To.

When the input signal IN goes low and the input signal /IN goes high, the voltage converter 3 outputs the output voltage $V_{CC}H$ provided by the booster circuit 2 to the gate of the first transistor Tr3. The first transistor Tr3 turns on in response to the output voltage $V_{CC}H$, and the second transistor Tr4 turns off in response to the low input signal IN. The output circuit 102 can then output the signal OUT at a level equivalent to the level of the supply voltage $V_{CC}$. This allows the output circuit 102 to have an improved load driving performance when compared with the output circuit 101 of the first example. When power supply to the output circuit 102 in the second example is cut off, the transistors Tr3 and Tr4 both turn off and the output circuit 102 is set to a high impedance state, as per the first example.

The output circuit 102 of the second example however requires the booster circuit 2 which normally operates in accordance with the supplied supply voltage $V_{CC}$ and clock signal CLK. The operation of this booster circuit 2 increases the consumed power of the output circuit 102. This output circuit 102 also requires the voltage converter 3. This requirement results in an increase to the size of the output circuit 102.

SUMMARY OF THE INVENTION

Accordingly, it is a primary objective of the present invention to provide an output circuit capable of maintaining power consumption rates at a constant level while being able to continuously drive a load.

To achieve the foregoing and other objects and in accordance with the purpose of the present invention, an improved output circuit is provided, which includes by reference to the following description taken in conjunction with the following figures.

Figure 3:
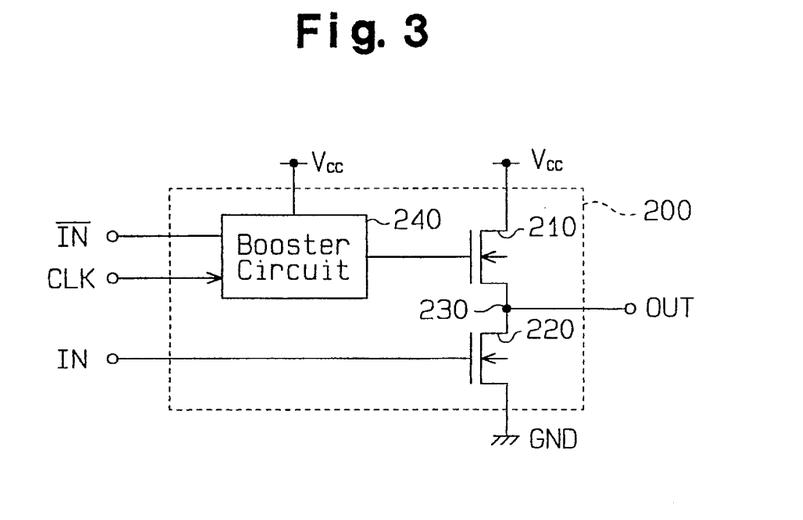
FIG. 3 is an explanatory diagram showing the outline of the present invention.

FIG. 3 shows an output circuit 200 which has first and second N channel MOS transistors 210 and 220 connected in series between a high-potential power supply $V_{CC}$ and a low-potential power supply GND. Both transistors 210 and 220 produce an output signal OUT at a node 230 between them in response to complementary input signals IN and /IN. The output circuit 200 has a booster circuit 240 connected to the first transistor 210. The booster circuit 240 is supplied with power from the high-potential power supply $V_{CC}$. In response to a clock signal CLK and the input signal /IN, which enables the first transistor 210, the booster circuit 240 produces a voltage higher than the potential level of the high-potential power supply $V_{CC}$, and applies the higher voltage to the first transistor 210.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

DETAILED DESCRIPTION OF THE PREFERRED EMBODIMENTS

Figure 4:
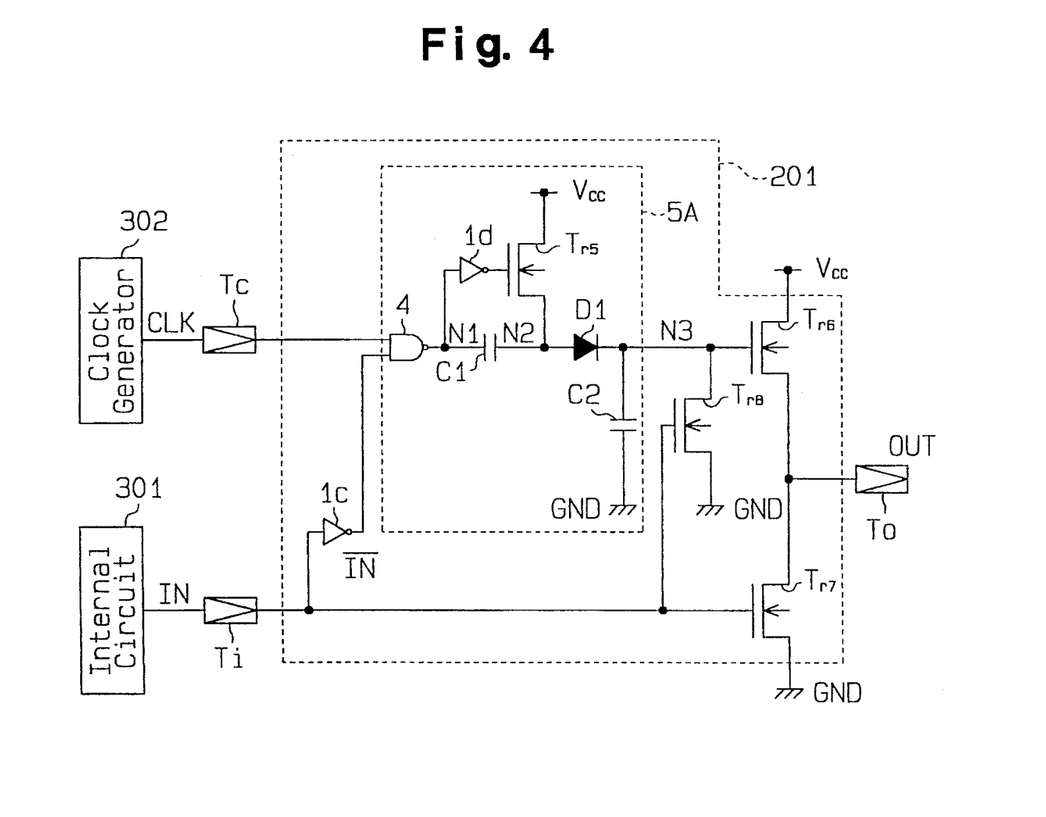
FIG. 4 is a circuit diagram showing an output circuit according to a first embodiment.
Figure 5A:
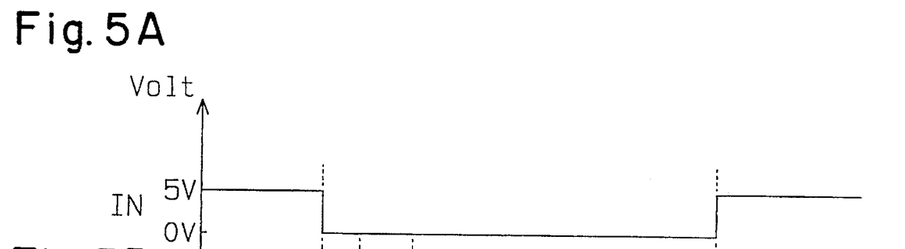
FIG. 5 is a timing chart illustrating the operation of the output circuit according to the first embodiment.
Figure 5B:
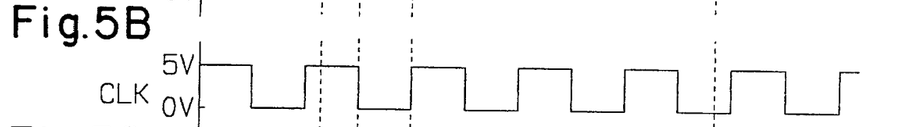
Figure 5C:
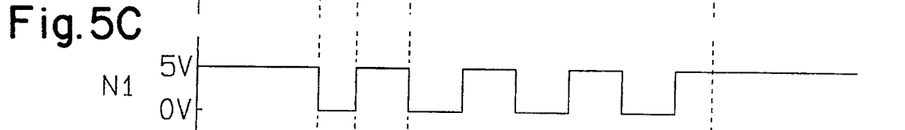
Figure 5D:
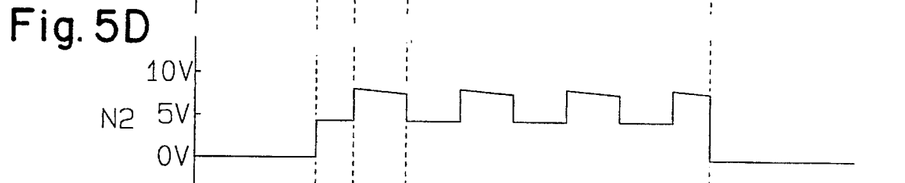
Figure 5E:
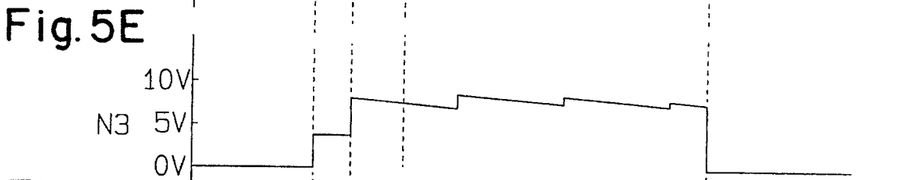
Figure 5F:
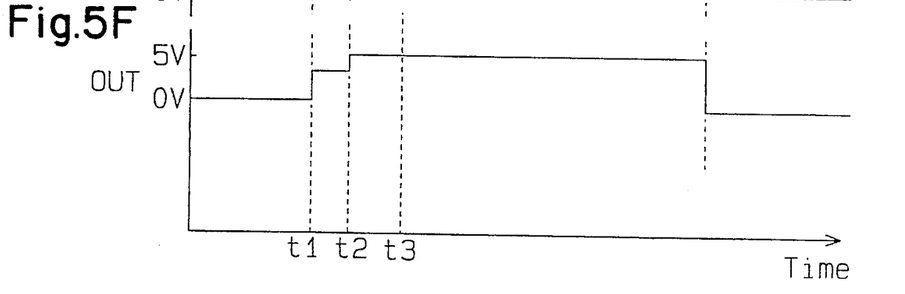

An output circuit according to a first embodiment of the present invention will now be described with reference to FIGS. 4 and 5. This embodiment is an example of the present invention as adapted for use in a semiconductor integrated circuit as shown in FIG. 4.

The semiconductor integrated circuit includes an output circuit 201, an internal circuit 301 and a clock generator 302, which is connected via an input terminal Tc to the output circuit 201, performs a predetermined process and outputs a processed signal to the output circuit 201 as an input signal IN. The clock generator 302, which is connected via an input terminal Tc to the output circuit 201, produces a clock signal CLK in response to an oscillation output signal from an oscillator (not shown), and outputs the clock signal CLK to the output circuit 201. The output circuit 201 comprises an inverter circuit 1c, a pull-up first N channel MOS transistor Tr6, a pull-down second N channel MOS transistor Tr7, a booster circuit 5A and a third N channel MOS transistor Tr8.

The inverter circuit 1c is connected between the input terminal Ti and the booster circuit 5A. The inverter circuit 1c outputs an input signal /IN as an inverted input signal IN to the booster circuit 5A. The input terminal Ti is connected to the internal circuit 301. In response to the high input signal /IN and the clock signal CLK, the booster circuit 5A supplies the first transistor Tr6 with an amplified gate signal exceeding the voltage level of the high-potential power supply $V_{CC}$ (5 V in this case). The first transistor Tr6 has a drain connected to the power supply $V_{CC}$ and a source connected to an output terminal To. The first transistor Tr6 turns on in response to the gate signal. The second transistor Tr7 has a drain connected to the output terminal To and a source connected to a ground GND. The third transistor Tr8 has a drain connected to the gate of the first transistor Tr6, a source connected to the ground GND and a gate connected to the gate of the second transistor Tr7. The third transistor Tr8 operates in response to the input signal IN input through the gate.

The booster circuit 5A includes a NAND circuit 4, first and second capacitors C1 and C2, an inverter circuit 1d, a fourth N channel MOS transistor Tr5, and a diode D1. The NAND circuit 4 has a first input terminal for receiving the clock signal CLK, a second input terminal for receiving the output signal (input signal /IN) of the inverter circuit 1c and an output terminal (node N1). In response to both the high input signal /IN from the inverter circuit 1d and the clock signal CLK, the NAND circuit 4 alternately outputs inverted signals of the clock signal CLK.

The capacitor C1 has a first lead connected to the output terminal of the NAND circuit 4 and a second lead connected to the anode (node N2) of the diode D1. The inverter circuit 1d has an input terminal connected to the output terminal of the NAND circuit 4 and an output terminal connected to the gate of the fourth transistor Tr5. The fourth transistor Tr5 has a drain connected to the power supply $V_{CC}$ and a source connected to the anode of the diode D1. The diode D1 has the anode and a cathode (node N3) connected to the gate of the first transistor Tr6. The capacitor C2 has a first lead connected to the node N3 and a second lead connected to the ground GND.

With the supply voltage $V_{CC}$ supplied to this output circuit 201, when the input signal IN processed by the internal circuit 301 goes high, the second and third transistors Tr7 and Tr8 turn on. In response to both the low input signal /IN from the inverter circuit 1c and the clock signal CLK from the clock generator 302, the NAND circuit 4 outputs a signal high, irrespective of the level of the clock signal CLK. The inverter circuit 1d outputs a low level signal in response to that high output signal from the NAND circuit 4. In response to the low output signal, the fourth transistor Tr5 turns off. The capacitor C1 then charges up to the potential provided by the NAND circuit 4. The potential at the node N1 is then set to the level of the supply voltage $V_{CC}$. As the third transistor Tr8 turns on, the capacitor C2 discharges to ground GND, setting the potentials at the nodes N2 and N3 low. The first transistor Tr6 turns off by the low-potential at the node N3, and the output circuit 201 outputs the low output signal OUT.

When the input signal IN goes low at time t1, the second and third transistors Tr7 and Tr8 turn off. The NAND circuit 4 outputs a low level signal in response to both the high input signal /IN from the inverter circuit 1c and the high clock signal CLK. Accordingly, the potential at the node N1 is set low. In response to the low output signal, the inverter circuit 1d outputs a high level signal, turning on the fourth transistor Tr5. In accordance with the ON action of the fourth transistor Tr5, the capacitors C1 and C2 perform charging with the power from the power supply $V_{CC}$, causing the potentials at the nodes N2 and N3 to rise. As a result, the first transistor Tr6 turns on.

At time t2, the NAND circuit 4 outputs a high level signal in response to both the high input signal /IN and the low clock signal CLK. The fourth transistor Tr5 turns off in response to the low signal from the inverter circuit 1d. Consequently, the potential at the node N1 is pulled up to the supply voltage $V_{CC}$ potential from ground GND. Consequently, the potential at the node N2 is pulled up. The capacitor C2 charges in accordance with the potential rise at the node N2, raising the potential at the node N3.

At time t3, the NAND circuit 4 outputs the low signal in response to both the high input signal /IN and the high clock signal CLK. As a result, the potentials at the nodes N1 and N2 fall. The diode D1 inhibits the flow of current resulting from the discharge of the capacitor C2 from reaching the node N2. Nonetheless, the capacitor C2 maintains the potential at the node N3 higher than the level of the supply voltage $V_{CC}$. With the correct sequence of switching, charging and discharging operations, the booster circuit 5A boosts the potential at the node N3 to double the potential level of the supply voltage $V_{CC}$, i.e., to near 10 V. The boosted gate potential turns the first transistor Tr6 on, which in turn causes signal OUT to be provided as output from circuit 201 at either a high or at the level of the supply voltage $V_{CC}$.

When a low signal IN is input to output circuit 201, the NAND circuit 4 receives the clock signal CLK and the booster circuit 5A operates to boost the potential at the node N3 to the potential level of the supply voltage $V_{CC}$. This operation causes the circuit 201 to output signal OUT at the potential of the supply voltage $V_{CC}$. At this potential, signal OUT has increased ability to drive the load (not shown) connected via a bus (not shown) to the output terminal To. Since the booster circuit 5A performs the boosting operation only with a low input signal IN, the booster circuit 5A of this embodiment needs less power than conventional booster circuits. Thus when the fourth transistor Tr5 turns on or off in response to the clock signal CLK, it is possible to pull the potential at the node N2 up in order to charge the capacitor C2. Since the ON/OFF action of the fourth transistor Tr5 consumes only a minimum of power when capacitor C2 charges. Power consumption by booster circuit 5A further reduces overall power consumption. Moreover, the number of the elements needed in the booster circuit 5A is considerably less than conventional booster circuits and voltage converters. Consequently, the size of the output circuit 201 will not degrade integration of the semiconductor circuit.

Second Embodiment

Figure 6:
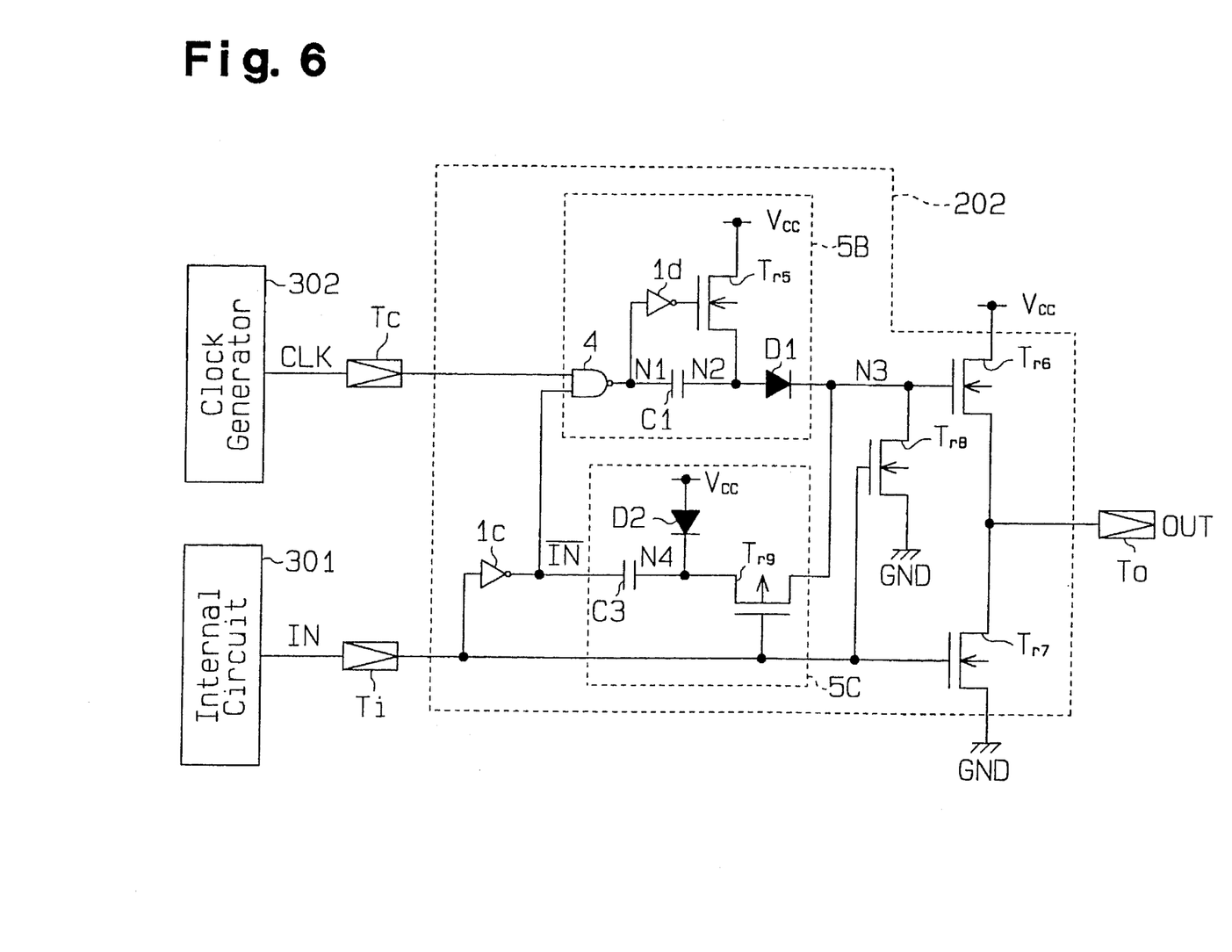
FIG. 6 is a circuit diagram showing an output circuit according to a second embodiment.
Figure 7A:
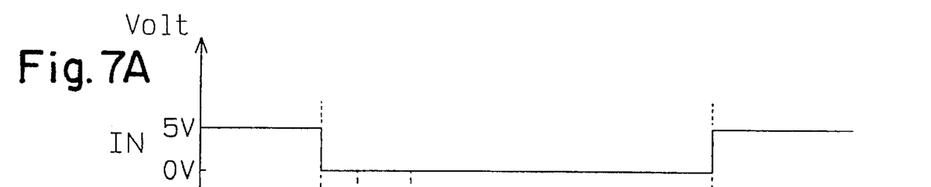
FIG. 7 is a timing chart illustrating the operation of the output circuit according to the second embodiment.
Figure 7B:
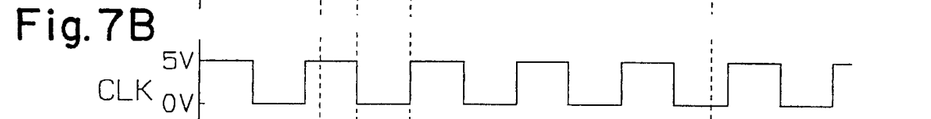
Figure 7C:
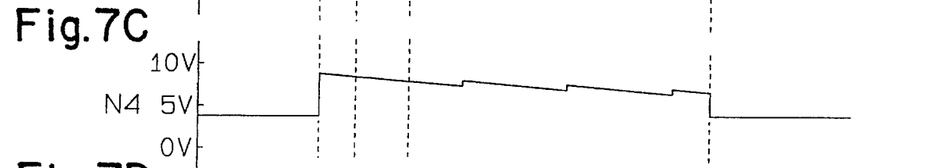
Figure 7D:
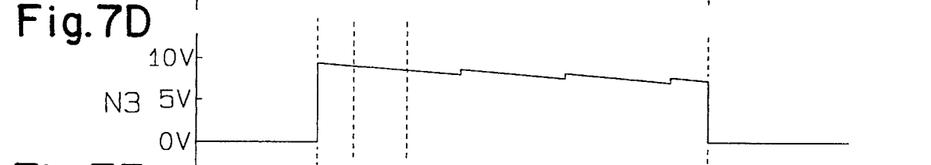
Figure 7E:
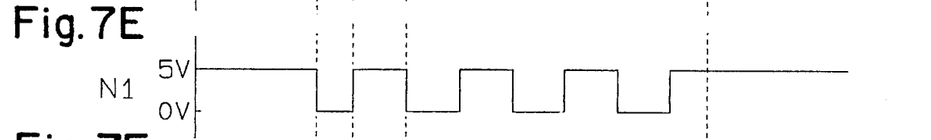
Figure 7F:
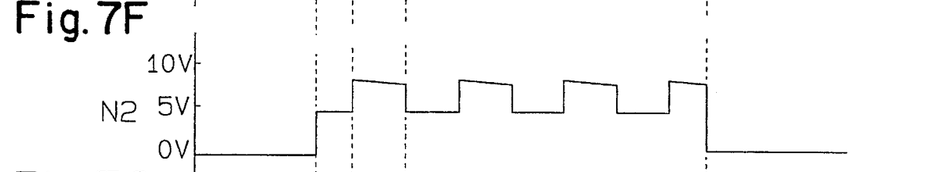
Figure 7G:
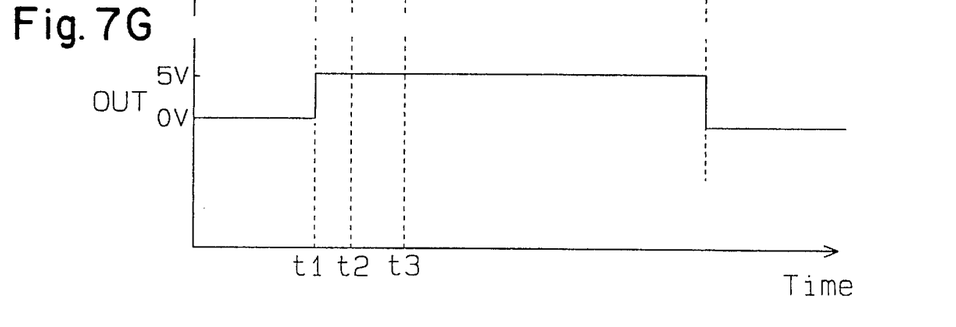

An output circuit according to a second embodiment of this invention will be described with reference to FIGS. 6 and 7. This embodiment is an example of this invention as adapted for use in a semiconductor integrated circuit as shown in FIG. 6. The output circuit 202 of this embodiment includes first and second booster circuits 5B and 5C. Other than these two circuits, the remaining structure of the output circuit 202 remains unchanged from the first embodiment. For purposes of clarity, identical reference numerals are used in the first and second embodiments to designate corresponding and identical elements.

The booster circuit 5B is the booster circuit 5A of the first embodiment with the capacitor C2 omitted. The booster circuit 5C includes a capacitor C3, a diode D2 and a fifth P channel MOS transistor Tr9. The diode D2 has a cathode (node N4) connected to the output terminal of the inverter circuit 1c via the capacitor C3, and an anode connected to the power supply $V_{CC}$. The fifth transistor Tr9 has a drain (or source) connected to the cathode of the diode D2, a source (or drain) connected to the gate of the first transistor Tr6, and a gate connected to a node between the input terminal Ti and the gate of the second transistor Tr7.

With the supply voltage $V_{CC}$ provided to output circuit 202, and with a high input signal IN, the second and third transistors Tr7 and Tr8 turn on and the fifth transistor Tr9 turns off. In the booster circuit 5C, the capacitor C3 is charged with the power supplied from the power supply $V_{CC}$ via the diode D2. As a result, the potential level at the node N4 decreases below the level of the supply voltage $V_{CC}$ by the threshold value of the diode D2. The NAND circuit 4 in the booster circuit 5B outputs a high level signal in response to both the low input signal /IN and the clock signal CLK. The high output from the NAND circuit 4 sets node 1 high and charges the capacitor C1, while the potential at nodes N2 and N3 are set low. The first transistor Tr6 turns off in response to the low level at node N3 causing the output circuit 202 to supply a low output signal OUT.

As illustrated in FIG. 7, when the input signal IN goes low at time t1, the second and third transistors Tr7 and Tr8 turn off and the fifth transistor Tr9 turns on. The high input signal /IN from the inverter circuit 1c charges the capacitor C3 while the potential at the node N4 is spontaneously pulled up to nearly double the potential level of the supply voltage $V_{CC}$. The potential difference between the nodes N3 and N4 is constant (or maintained) when the fifth transistor Tr9 turns on. Therefore, as the potential of the node N4 rises, the node N3 is rapidly boosted from ground potential to nearly double the potential level of the supply voltage $V_{CC}$. As a result, the first transistor Tr6 turns on.

At time t2, the NAND circuit 4 outputs a high level signal, pulling the potential at node N1 up as well as the potential at node 2, as in the first embodiment. When the potential at the node N2 becomes higher than that at the node N3, the potential at the node N3 is kept higher than the level of the supply voltage $V_{CC}$ by the potential at the node N2.

At time t3, low output signal from the NAND circuit 4 causes the potentials at the nodes N1 and N2 to fall. The diode D1 inhibits the current flow, resulting from the discharge of capacitor C3, from reaching the node N2. The capacitor C3 keeps the potential at the node N3 at a level higher than the level of the supply voltage $V_{CC}$. This operation allows the potential at the node N3 to be kept at about twice the potential level of the supply voltage $V_{CC}$. The first transistor Tr6 turns on due to the potential at the node N3, allowing the output circuit 202 to provide signal OUT at the potential of supply voltage $V_{CC}$ from the output terminal To. Accordingly, the output circuit 202 is capable of driving a load connected to the output terminal To.

The booster circuit 5B performs the boosting operation only when the input signal IN goes low or the output signal OUT goes high. During the boosting operation, the capacitor C3 is charged by the ON/OFF action of the fourth transistor Tr5. This causes the potential at the node N3 to be kept higher than the potential level of the supply voltage $V_{CC}$. There is not much power consumed by the ON/OFF action of the fourth transistor Tr5 at the time of charging the capacitor C3. When the level of the input signal IN switches high to low, the booster circuit 5C operates only once. This lowers the power requirements of the circuits 5B and 5C from that of conventional booster circuits. Moreover, the number of the elements needed in the booster circuits 5B and 5C is considerably smaller than in conventional booster circuits and voltage converters. Consequently, the size of the output circuit 202 will not degrade integration of the semiconductor circuit.

When the input signal IN falls low, the booster circuit 5C promptly boosts the potential at the node N3 above the level of supply voltage $V_{CC}$. This decreases the rise time for the signal OUT provided by the output circuit 202, allowing for an improved response time for the circuit 202 compared with other output circuits.

Figure 8:
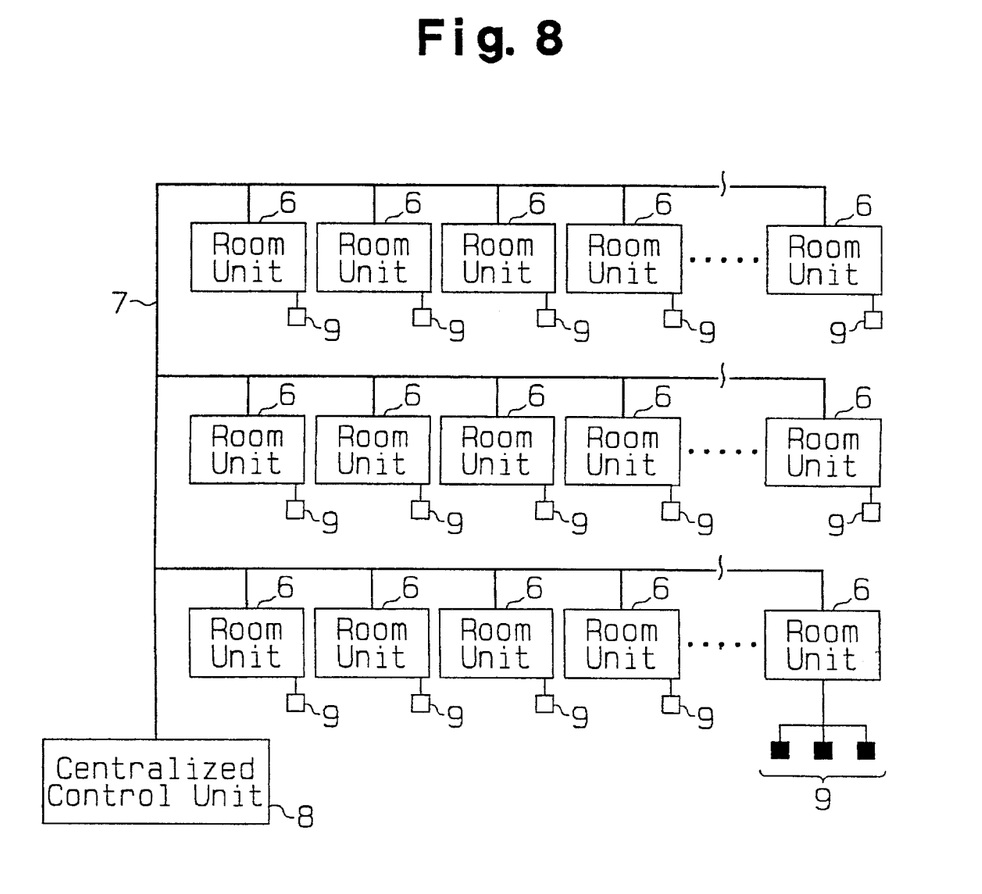
FIG. 8 is a block diagram of an air conditioning system for a building, illustrating an example of the usage of the output circuits according to the first and second embodiments.
Figure 9:
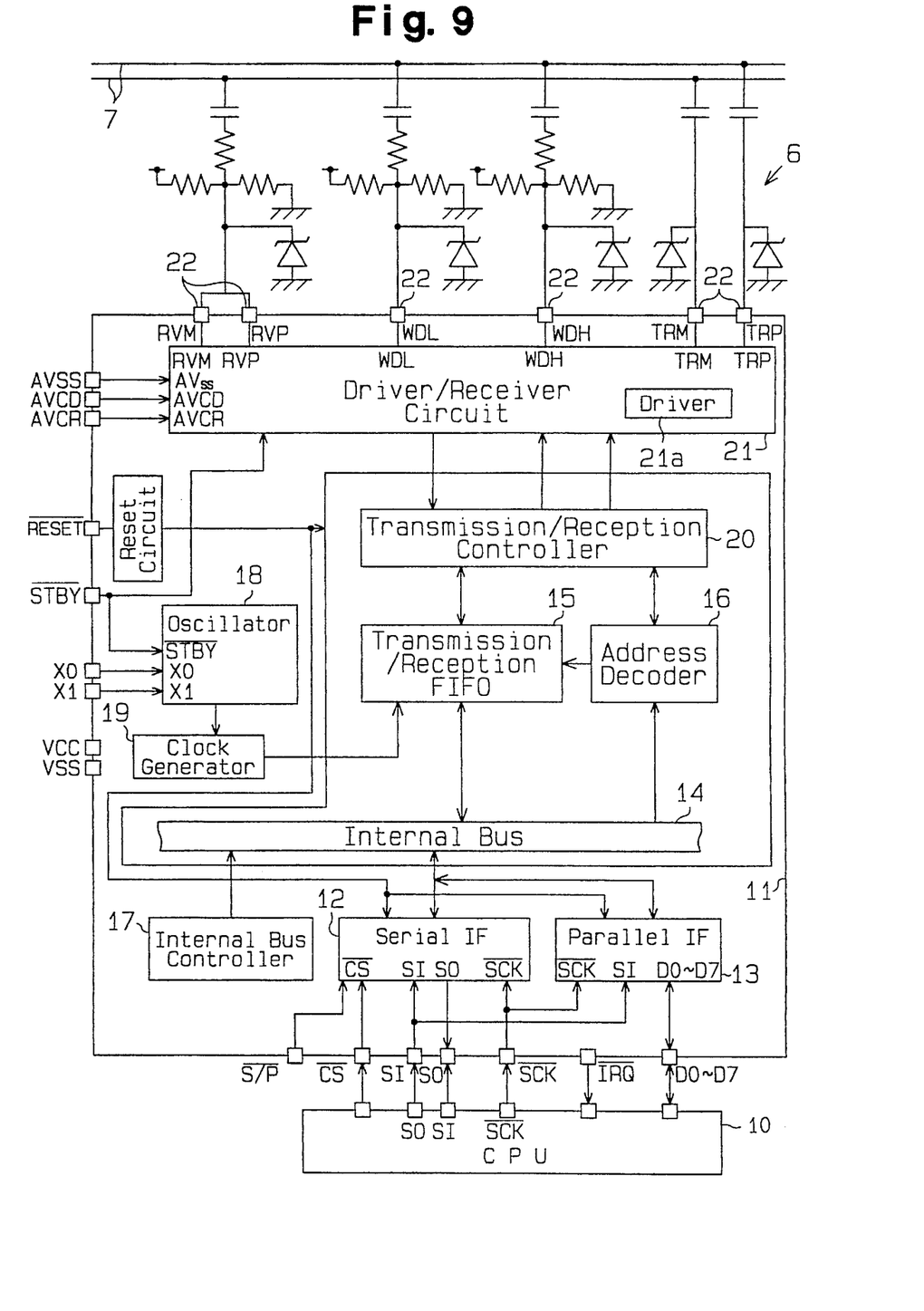
FIG. 9 is a block diagram showing a room unit of the building air conditioning system shown in FIG. 8.

It is apparent from the above that the output circuits 201 and 202 of the first and second embodiments are useful in systems as shown in FIGS. 8 and 9, for example. FIG. 8 exemplifies a building air conditioning system, which includes multiples room units 6, a centralized control unit 8, and a bus 7 which connects both units 6 and 8. Connected to each room unit 6 is an operation device 9, such as an ON/OFF switch which controls each units operation.

FIG. 9 shows one example of the room unit 6, which includes a CPU 10 and a control IC 11. The control IC 11 has a driver/receiver circuit 21 which incorporates a driver 21a as the load for either output circuit 201 or 202. The control IC 11 further includes a serial interface 12, a parallel interface 13, an internal bus 14, a transmission/reception FIFO (First In First Out) memory 15, an address decoder 16, an internal bus controller 17, an oscillator 18, a clock generator 19 and a transmission/reception controller 20.

The CPU 10 controls the control IC 11 through the serial interface 12 and the parallel interface 13. The serial interface 12 and the parallel interface 13 are connected via the internal bus 14 to the FIFO memory 15 and the address decoder 16. The internal bus controller 17 controls the internal bus 14. The oscillator 18 outputs an oscillation signal to the clock generator 19. In response to the oscillation signal, the clock generator 19 outputs a clock signal to the FIFO memory 15. The address decoder 16 outputs an address signal to the FIFO memory 15.

In response to a control signal from the CPU 10, the FIFO memory 15 performs writing and reading operations in accordance with the clock signal and address signal. The FIFO memory 15 is connected to the transmission/reception controller 20, which is further connected to the driver/receiver circuit 21.

Although two embodiments of the present invention have been described herein, it should be apparent to those skilled in the art that the present invention may be embodied in many other specific forms without departing from the spirit or scope of the invention. Particularly, it should be understood that this invention may be embodied in the following forms.

In the first and second embodiments, the booster circuits 5A and 5B may operate in response to a system controlling clock signal generated by an external device (control unit, such as the CPU) instead of the clock signal produced by the clock generator 302.

Figure 10:
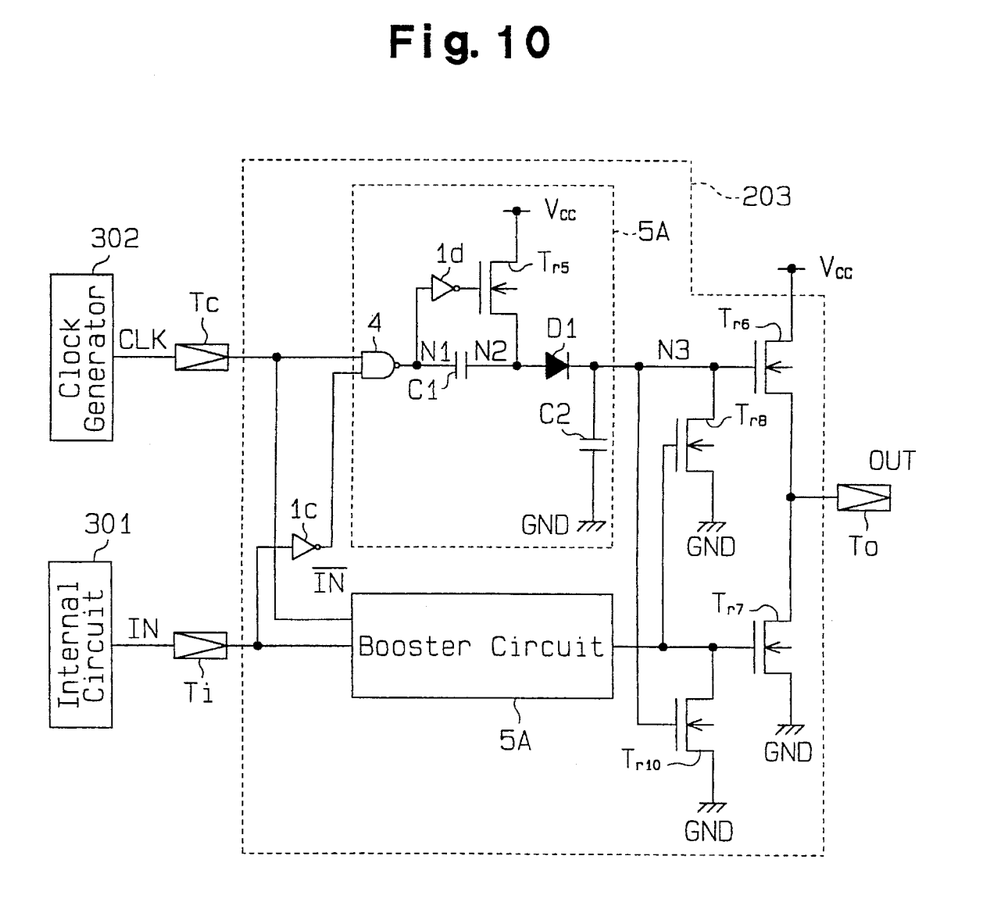
FIG. 10 is a circuit diagram showing an output circuit according to another embodiment.

A booster circuit (5A) with the same structure as the booster circuit 5A of the first embodiment may be provided on the side of the second transistor Tr7 as in an output circuit 203 shown in FIG. 10. In this case, it is necessary to provide a sixth N channel MOS transistor Tr10 with a gate connected to the gate of the first transistor Tr6, a drain connected to the gate of the second transistor Tr6 and a source connected to the ground GND. The additional provision of the booster circuit 5A enhances the performance of the second transistor Tr7 and permits a low level output of the signal OUT from the output terminal To. This improves the load driving performances of the output circuit 203 as compared with other output circuits.

Further forms of the present invention may utilize a P channel MOS transistor in place of the inverter circuit 1d and the fourth N channel MOS transistor Tr5, the third N channel MOS transistor Tr8 may be replaced with an inverter circuit and a P channel MOS transistor and the fifth P channel MOS transistor Tr9 may be replaced with an inverter circuit and an N channel MOS transistor.

Therefore, the present examples and embodiments are to be considered as illustrative and not restrictive and the invention is not to be limited to the details given herein, but may be modified within the scope of the appended claims.

What is claimed is:

1. A semiconductor device having improved load driving characteristics when powered by a high-potential power supply and a low-potential power supply, the device comprising:

an internal circuit portion for producing a first signal; and an output circuit portion coupled to said internal circuit portion of the semiconductor device for driving the load in response to a clock signal and said first signal, said output circuit portion further comprising, a first N channel MOS transistor and a second N channel MOS transistor coupled in series between the high and low power supplies, said second N channel MOS transistor being supplied with a first input signal; and a booster circuit coupled between said high-potential power supply and said first N channel MOS transistor for providing said first N channel MOS transistor with a boosted input signal at a potential higher than that of the high-potential power supply in response to the clock signal and a second input signal, said first and second N channel MOS transistors operating to provide an output signal from said output circuit at a node between said first and second N channel MOS transistors, wherein said booster circuit includes a gate circuit responsive to said second input signal and said clock signal for regulating the operation of said booster circuit.

2. The output circuit according to claim 1, wherein the first and second input signals are complements of each other.

3. An output circuit for driving the load of a semiconductor device powered by a high-potential power supply and a low-potential power supply, said output circuit comprising:

a first N channel MOS transistor and a second N channel MOS transistor coupled in series between the high and low power supplies, said second N channel MOS transistor being supplied with a first input signal; and a booster circuit coupled between said high-potential power supply and said first N channel MOS transistor for providing said first N channel MOS transistor with a boosted input signal at a potential higher than that provided by said high-potential power supply in response to a clock signal and a second input signal, said first and second N channel MOS transistors operating to provide an output signal from said output circuit at a node between said first and second N channel MOS transistors, wherein said booster circuit includes a gate circuit responsive to said second input signal and said clock signal for regulating the operation of said booster circuit.

4. The output circuit according to claim 3, wherein the first and second input signals are complements of each other.

5. An output circuit for driving the load of a semiconductor device powered by a high-potential power supply and a low-potential power supply, said output circuit comprising:

a first N channel MOS transistor and a second N channel MOS transistor coupled in series between the high and low power supplies, said second N channel MOS transistor being supplied with a first input signal; and a booster circuit coupled between said high-potential power supply and said first N channel MOS transistor for providing said first N channel MOS transistor with a boosted input signal at a potential higher than that provided by said high-potential power supply in response to a clock signal and a second input signal, said first and second N channel MOS transistors operating to provide an output signal from said output circuit at a node between said first and second N channel MOS transistors, said booster circuit including a gate circuit responsive to said second input signal and said clock signal for regulating the operation of said booster circuit;

a step-up voltage generator coupled to the output of said gate circuit and to said high-potential power supply for providing a stepped-up voltage signal to said first N channel MOS transistor at a potential higher than said high-potential power supply in response to said clock signal;

a hold circuit responsive to the stepped-up voltage signal, for holding the potential level of the stepped-up voltage signal at a constant.

6. The output circuit according to claim 5, wherein said gate circuit includes a NAND circuit having an output terminal;

wherein said step-up voltage generator includes a first switch element, coupled between said high-potential power supply and one terminal of a first capacitor, said output terminal being coupled to said first switch element and a second terminal of said first capacitor;

wherein said hold circuit includes a circuit element, coupled between said first capacitor and said gate of said first N channel MOS transistor, and a second capacitor coupled between said gate of said first N channel MOS transistor and said low-potential power supply, said circuit element and said second capacitor preventing said stepped-up voltage from said step-up voltage generator from falling; and wherein said output circuit further comprises a second switch element, coupled between said gate of said first N channel MOS transistor and said low-potential power supply, for pulling the potential at said gate down to the potential of a low-potential power supply in response to said first input signal.

7. The output circuit according to claim 6, wherein said first switch element includes:

an inverter circuit coupled to said output terminal; and an N channel MOS transistor having a control terminal coupled to said inverter circuit and another terminal coupled to said one terminal of said first capacitor.

8. The output circuit according to claim 6, wherein said circuit element includes a diode for inhibiting a current from flowing to said first capacitor from said second capacitor.

9. The output circuit according to claim 6, wherein said second switch element includes an N channel MOS transistor having a control terminal coupled to said gate of said second N channel MOS transistor and a terminal other than the control terminal coupled to a gate of said first N channel MOS transistor.

10. An output circuit for driving the load of a semiconductor device powered by a high-potential power supply and a low-potential power supply, said output circuit comprising:

a first N channel MOS transistor and a second N channel MOS transistor coupled in series between the high and low power supplies, said second N channel MOS transistor being supplied with a first input signal; and a booster circuit coupled between said high-potential power supply and said first N channel MOS transistor for providing said first N channel MOS transistor with a boosted input signal at a potential higher than that provided by said high-potential power supply in response to a clock signal and a second input signal, said first and second N channel MOS transistors operating to provide an output signal from said output circuit at a node between said first and second N channel MOS transistors, wherein said booster circuit includes a gate circuit responsive to said second input signal and said clock signal for regulating the operation of said booster circuit;

a first step-up voltage generator coupled between said gate circuit and said first N channel MOS transistor for providing a first stepped-up voltage signal to said first N channel MOS transistor at a potential higher than said high-potential power supply, in response to an output from said gate circuit, said first step-up voltage generator and said first N channel MOS transistor having a node formed therebetween;

a second step-up voltage generator coupled to the node for providing a second stepped-up voltage signal to said first N channel MOS transistor at a potential higher than said high-potential power supply in response to said second input signal, said first and second step-up voltage generators operating to maintain the potential level of said first stepped-up voltage signal at a constant.

11. The output circuit according to claim 10, wherein said gate circuit includes a NAND circuit having an output terminal;

wherein said first step-up voltage generator includes a first switch element, coupled between said high-potential power supply and said output terminal of said NAND circuit, for performing a switch operation in response to an output signal from said NAND circuit; a first capacitor coupled between said output terminal and said first switch element; and a circuit element, coupled between said first capacitor and said gate of said first N channel MOS transistor;

wherein said second step-up voltage generator includes a diode having an anode coupled to said high-potential power supply and a cathode; a second capacitor coupled to said cathode, and said second input signal, said second capacitor and said circuit element preventing said first stepped-up voltage produced from said first step-up voltage generator from falling; and a second switch element, coupled between said second capacitor and said node responsive to said first input signal; and wherein said output circuit further comprises a third switch element, coupled between said gate of said first N channel MOS transistor and said low-potential power supply, for pulling the potential at said gate down to the potential of the low-potential power supply in response to said first input signal.

12. The output circuit according to claim 11, wherein said first switch element includes:

an inverter circuit coupled to said output terminal; and an N channel MOS transistor having a control terminal coupled to said inverter circuit and a terminal other than the control terminal coupled to said first capacitor.

13. The output circuit according to claim 11, wherein said circuit element includes a diode for inhibiting a current from flowing to said first capacitor from said second capacitor.

14. The output circuit according to claim 11, wherein said second switch element includes a P channel MOS transistor having a control terminal coupled to a gate of said second N channel MOS transistor.

15. The output circuit according to claim 11, wherein said third switch element includes an N channel MOS transistor having a control terminal coupled to said gate of said second N channel MOS transistor and a terminal other than the control terminal coupled to a gate of said first N channel MOS transistor.

* * * * *